United States Patent [19]

Matson et al.

[11] Patent Number: 4,847,507

[45] Date of Patent: Jul. 11, 1989

[54] FIBER OPTIC GUARD CROSSING OF CIRCUITS HAVING ANALOG AND DIGITAL SECTIONS

[75] Inventors: Don P. Matson, Everett; William A. Carpenter, Kingston, both of Wash.

[73] Assignee: John Fluke Mfg. Co., Inc., Everett, Wash.

[21] Appl. No.: 145,366

[22] Filed: Jan. 19, 1988

[51] Int. Cl.⁴ ............................................. G02B 27/00
[52] U.S. Cl. ..................... 250/551; 250/227; 455/602
[58] Field of Search ............... 250/551, 227, 205; 455/602, 608; 307/311

[56] References Cited

U.S. PATENT DOCUMENTS

| | | | |
|---|---|---|---|
| 4,008,390 | 2/1977 | Runge | 250/205 |
| 4,176,401 | 11/1979 | Lonberger | 307/311 |
| 4,622,586 | 11/1986 | Megeid | 455/608 |
| 4,678,946 | 7/1987 | Nagano | 250/551 |
| 4,703,471 | 10/1987 | Fitelson et al. | 455/608 |
| 4,756,025 | 7/1988 | Munz et al. | 455/602 |

Primary Examiner—David C. Nelms
Assistant Examiner—William L. Oen
Attorney, Agent, or Firm—Stephen A. Becker; Mikio Ishimaru

[57] ABSTRACT

For circuitry having analog and digital circuit sections and a signal flow path therebetween, a guard crossing for establishing electrical isolation and virtually no capacitive coupling between the two sections comprises optical fiber cables extending between circuit boards or between partitioned regions of a common circuit board carrying the analog and digital section for interfacing signals therebetween. Electrooptical transmitters and receivers in each section are coupled to the optical fiber cables. In accordance with one embodiment, bit serial signals are transmitted between the analog and digital sections through a single optical fiber cable for each direction. In another embodiment, a plurality of optical fiber cables for each direction carry the parallel bits of bit parallel signals between the two sections.

17 Claims, 3 Drawing Sheets

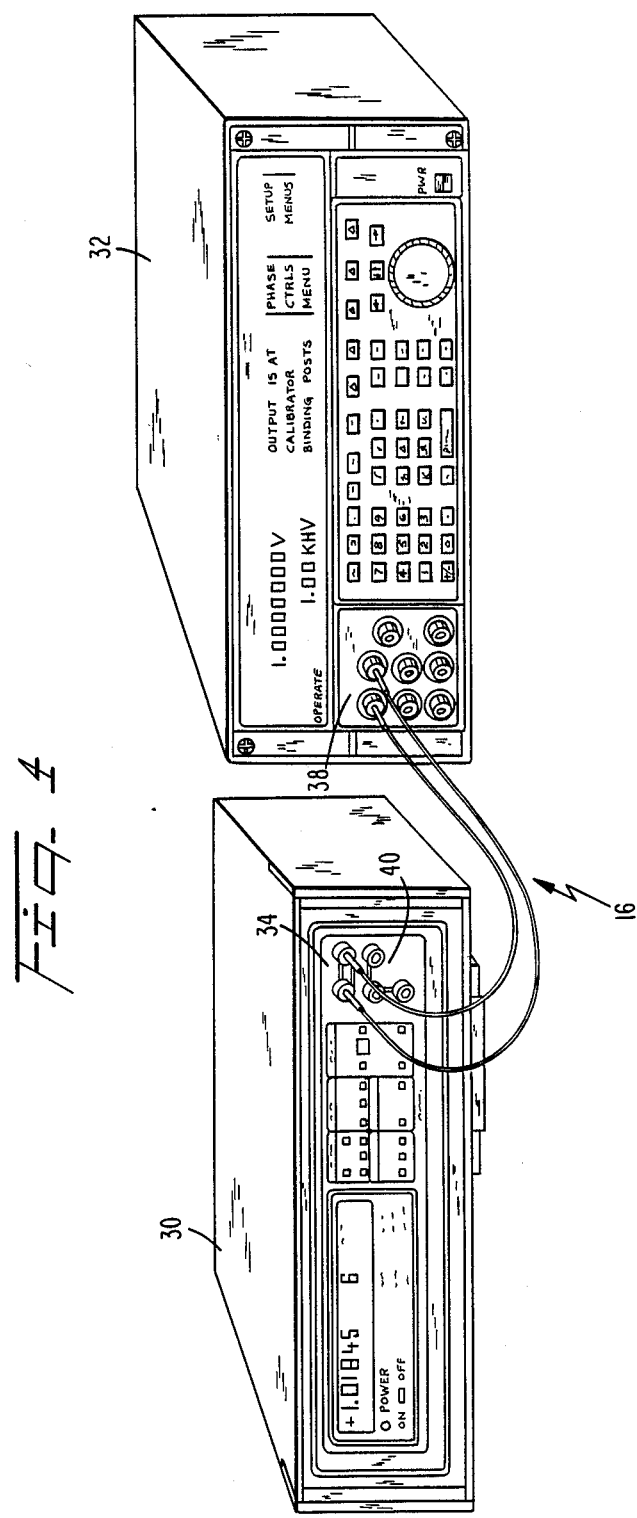

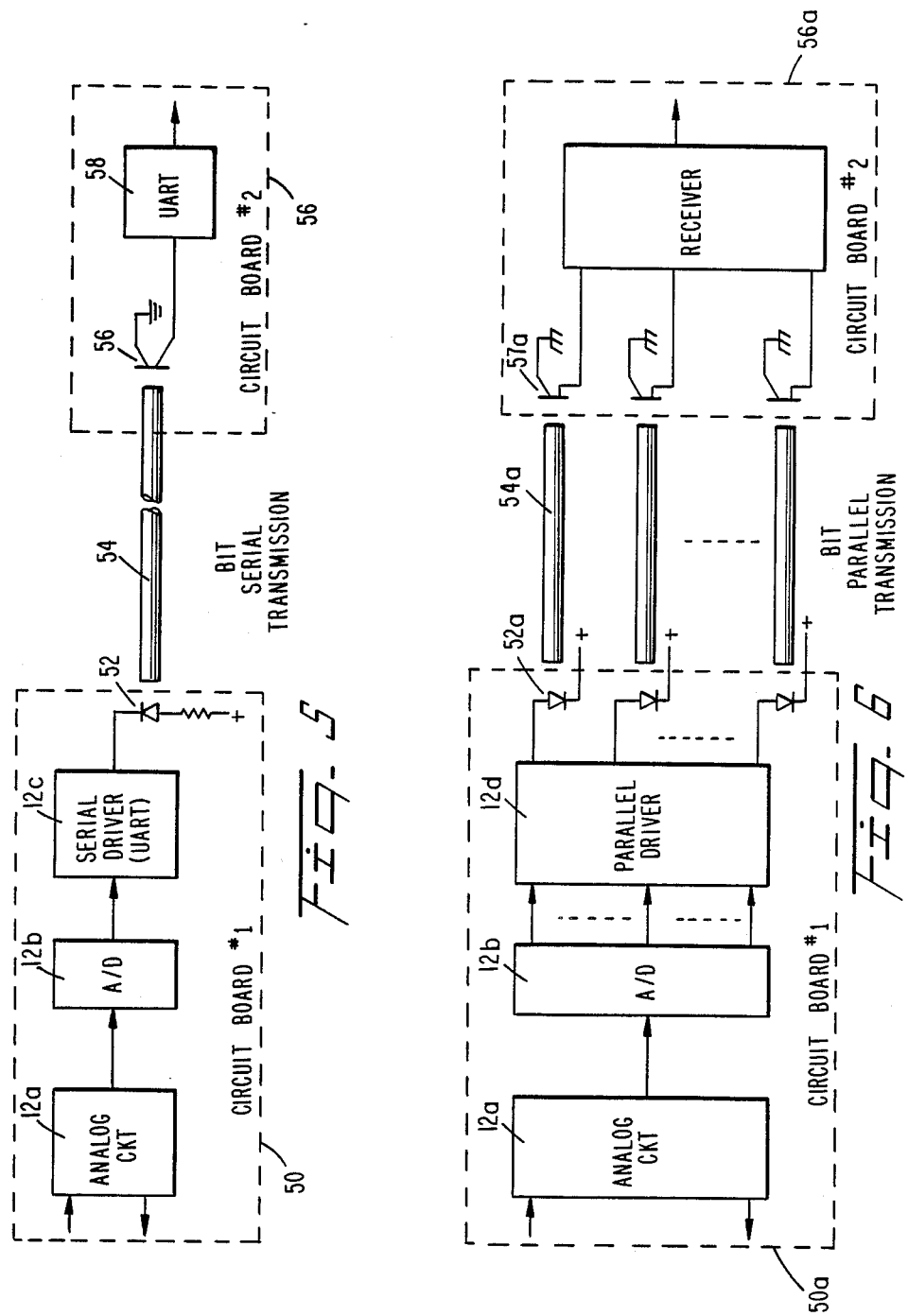

4,847,507

FIBER OPTIC GUARD CROSSING OF CIRCUITS HAVING ANALOG AND DIGITAL SECTIONS

TECHNICAL FIELD

This invention relates generally to circuit isolation, and more particularly toward guarded crossing between analog and digital circuitry using optical fiber interfacing.

BACKGROUND ART

Hybrid systems of a type involving both analog and digital circuitry usually require some form of isolation between the analog and digital circuit sections, to prevent contamination therebetween as a result of ground loops or capacitive coupling. One example of a hybrid system of this type is a laboratory instrumentation calibrator, such as a Model 5100 Multifunction Calibrator manufactured by the John Fluke Manufacturing Company, which generates precisely controlled analog signals as calibration standards for instrumentation such as digital voltage meters. In this case, an analog circuit section of the hybrid system carries out measurement of very low amplitude analog input signals, conversion of the analog signals to digital signals for processing in the digital circuit section which usually includes a microprocessor and development of analog output signals in response to digital control signals developed by the digital circuit section.

To maintain a precisely controlled analog output signal, it is imperative that the analog and digital circuit sections be maintained electrically isolated from each other so that, for example, ground loop currents will not flow between circuit sections and high frequency components of digital signals will not be coupled to the analog section as noise, thereby raising the potential of the analog ground plane and inducing spurious components into the analog output signal. Similarly, isolation would prevent sharp changes in the analog signal from being coupled to the digital circuit section producing logical errors therein.

Guarded crossings allow the guarded sections to float at a different potential from the chassis of the instrument, which usually is at or near earth potential, and also serve to minimize both electrical and magnetic coupling between guarded and unguarded sections of an instrument. Three techniques for isolating the analog and digital circuit sections using "guarded crossings" are often employed.

A first type of guarded crossing is single ended transformer isolation, shown in FIG. 1, wherein digital signals are transmitted in serial form through the primary and secondary windings 10a, 10b of a pulse transformer 10 interfacing an analog circuit section 12 comprising analog input and output signal processing circuitry 12a, an analog-to-digital converter 12b and a driver 12c, and a digital circuit 14 driven by the analog circuit 12 through the transformer 10 and a buffer 14a. A similar pulse transformer (not shown) couples digital signals in the opposite direction, if bidirectional data transmission is required, e.g., to return reading or status information to the circuit 12. This technique is characterized by relatively low cost and low capacitive coupling; however, the transformer is susceptible to common mode voltage transients since the transformer is referenced to ground. Furthermore, voltage level shifting and detection that are required as a result of transformer isolation, particularly at high frequencies, increase cost and complexity of signal processing circuitry within the instrument.

A second type of guarded crossing is balanced pulse transformer isolation, shown in FIG. 2, wherein pulse transformer 16 has center-tapped primary and secondary windings 16a, 16b that are grounded, as shown, to present a balanced output to receiver 18 and thereby to reduce the effect of common mode voltage transients. One transformer couples a signal positively and the other signal is driven by an inverted signal, as shown in the Figure. On the receiving end, the transformers drive circuitry which recreate the original waveform. Zener diodes 18a, 18b at the receiving end minimize the response of pulse transients, and since the transformers are balanced, the circuit does not respond to common mode voltage transients. However, the cost of this type of guarded crossing is greater than that of single winding transformer isolation, and there is capacitive coupling between the primary and secondary windings which couples high frequency transients between the isolated circuits.

A third type is optocoupling, shown in FIG. 3, wherein optical coupler 20 consists of an LED and light responsive transistor sealed within an optically opaque enclosure 22 for coupling digital signals between isolated circuits through a universal asynchronous receiver and transmitter (UART) 23. Because optocouplers have a relatively high value of internal capacitance, in high frequency applications wherein common voltage transients tend to appear on the guarded side of the circuitry the transients are directly coupled into the circuitry of the unguarded side to affect threshold levels and propagation delays of digital circuitry therein. The cost of incorporating error correcting circuitry or software into the system, or of employing optical couplers having better high frequency isolation characteristics, is high.

DISCLOSURE OF THE INVENTION

Accordingly, one object of the invention is to provide improved circuit isolation between partitioned sections of electronic circuitry.

Another object of the invention is to provide improved guarded crossing between isolated sections of signal processing circuitry.

A further object of the invention is to provide improved guarded crossing between analog and digital circuit portions of electronic circuitry.

Another object is to provide improved guarded crossing between isolated circuit sections, wherein there is virtually no capacitive coupling between the sections through the guard.

A further object of the invention is to provide improved guarded crossing between analog and digital sections of a multifunction calibrator, wherein virtually no transient noise components are coupled between the sections by capacitive coupling through the guard.

The above and other objects are satisfied, in accordance with the invention, by a guarded crossing for isolating first and second circuit sections containing respectively analog and digital circuit sections therein, comprising an optical fiber transmission medium for carrying digital signals between the two sections. A first electrooptical transmitter and receiver system in the analog section interfaces the analog circuitry therein with the optical fiber transmission medium, and a second similar electrooptical transmitter and receiver system in the digital section interfaces digital circuitry therein with the optical fiber transmission medium. Preferably, the analog section includes a signal converter between analog circuitry within the analog section and the optical fiber transmission medium for converting analog signals outgoing from the analog section to the digital section into digital signals and for converting digital signals incoming to the analog section into analog signals.

Each of the first and second electrooptical transmitter and receiver systems preferably includes a transmitter responsive to electrical signals applied thereto for generating corresponding light signals, and a receiver responsive to light signals applied thereto for generating corresponding electrical signals.

The optical fiber transmission medium, in a preferred embodiment, comprises a first optical fiber cable between the transmitter of the first electrooptical transmitter and receiver system and the receiver of the second electrooptical transmitter and receiver system, and a second optical fiber cable between the transmitter of the second electrooptical transmitter and receiver system and the receiver of said first electrooptical transmitter and receiver system. In accordance with one embodiment of the invention, the digital section comprises digital circuitry for processing digital signals in bit serial format, and the optical fiber cable comprises a first optical fiber cable between the transmitter of the first electrooptical transmitter and receiver system and the receiver of said second electrooptical transmitter and receiver system for carrying bit serial digital signals from the analog section to the digital section, and a second optical fiber cable between the transmitter of the second electrooptical transmitter and receiver system and the receiver of the first electrooptical transmitter and receiver system for carrying bit serial digital signals from the digital section to the analog section.

In accordance with another embodiment, the digital section comprises digital circuitry for processing digital signals in bit parallel format, and the optical fiber cable comprises a plurality first optical fiber cables between the transmitter of the first electrooptical transmitter and receiver system and the receiver of the second electrooptical transmitter and receiver system for carrying respectively parallel bits of the bit parallel digital signals from the analog section to the digital section, and a plurality of second optical fiber cables between the transmitter of the second electrooptical transmitter and receiver system and the receiver of the first electrooptical transmitter and receiver system for carrying respectively parallel bits of the bit parallel digital signals from the digital section to the analog section.

Preferably the analog and digital sections are located on separate circuit boards, and the optical fiber cable extends therebetween. The guarded crossing in the preferred embodiment is incorporated within a laboratory instrument calibrator, although the principles of the invention have broader applications.

Still other objects and advantages of the present invention will become readily apparent to those skilled in this art from the following detailed description, wherein only the preferred embodiment of the invention are shown and described, simply by way of illustration of the best mode contemplated of carrying out the invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 4 is a view of a calibrator employing the invention and an instrument undergoing calibration thereby.

FIG. 5 is a diagram of the invention using bit serial guarded circuitry using a single optical fiber cable in each direction for carrying serial data between the isolated sections.

FIG. 6 is a diagram of bit parallel guarded circuitry using a plurality of optical fiber cables in each direction for carrying parallel data between the isolated sections.

BEST MODE FOR CARRYING OUT THE INVENTION

Figure 1:
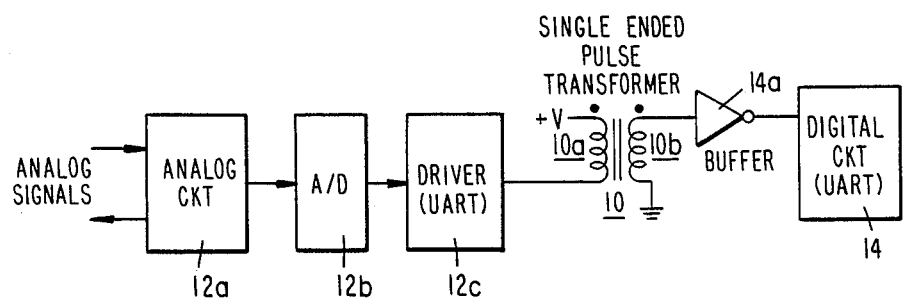
FIG. 1 is a circuit diagram of a guarded crossing of the prior art incorporating a single ended pulse transformer.
Figure 2:
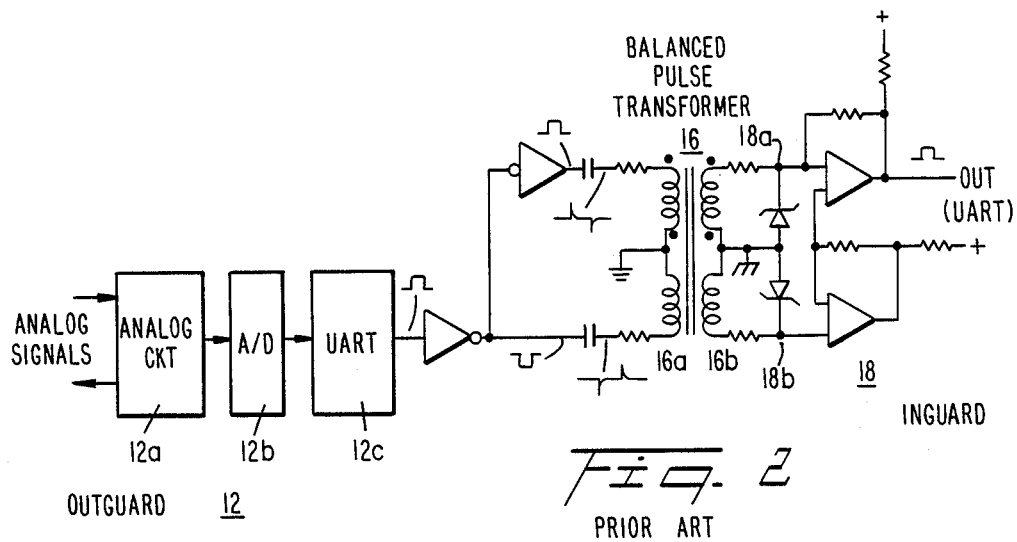
FIG. 2 is a circuit diagram of a guarded crossing of the prior art incorporating a balanced pulse transformer.
Figure 3:
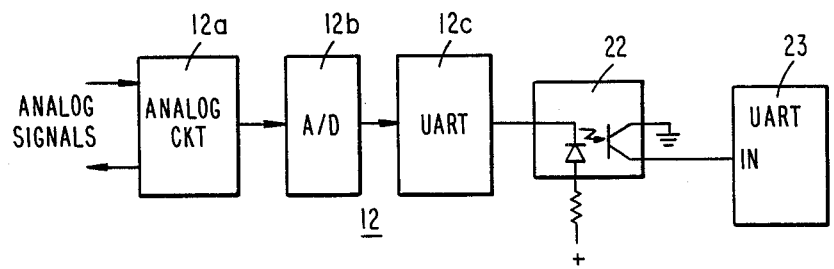
FIG. 3 is a circuit diagram of a guarded crossing of the prior art incorporating optoisolators.

Referring to FIG. 4, a multifunction calibrator 30 for generating a number of different types of output signals having precisely controlled characteristics, such as voltage, current, output impedance and frequency, is connected to a laboratory instrument 32, in this example, a digital multimeter, to be calibrated. The calibrator has a set of output terminals 34 that are wired, through leads 36, to input terminals 38 of the multimeter 32. Commonly, the calibrator 30 also has a pair of sense terminals 40, that measure load characteristics such as the terminal voltage of the multimeter 32 as feedback to the calibrator for processing by control circuitry therein (not shown).

The calibrator 30 has hybrid circuitry therein, consisting of analog and digital circuit sections, each preferably contained on a circuit board having a ground plane that is independent of that of the other. The analog circuit section comprises highly precise analog processing circuitry which in practice within a laboratory environment, must be capable of processing analog signals in the millivolts range. The analog circuitry is controlled by the digital circuit section that includes a microprocessor for responding to signals processed by the analog circuitry, converted into digital signals coupled to the digital circuit section, and then coupled back to the analog circuitry to carry out particular control functions.

In accordance with the invention, the analog and digital circuit sections, which are on separate circuit boards within the calibrator housing and are electrically isolated from each other so as to represent different ground planes, are coupled together optically through a guard crossing which comprises fiber optic cables together with associated electrooptical signal processing circuitry.

Referring to FIG. 5, a first circuit board 50 within calibrator 40 contains circuitry forming the analog circuit section, including analog signal processing circuitry 12a of the calibrator, for measuring input analog signals and, in response to digital processing thereof, generating output analog calibration signals, and an analog-to-digital converter 12b for converting the analog signal of circuit 12a into digital signals to be processed. Also on circuit board 50 is a serial driver 12c which supplies, in serial format, binary data obtained from converter 12b to an optical transmitter in the form of a light-emitting diode (LED) 52.

Mounted in registration with the LED 52 is one end of an optical fiber cable 54 that extends between board 50 and a second circuit board 56 containing digital processing circuitry within the housing of calibrator 40. In optical registration with the opposite end of optical fiber cable 54 is a light detector in the form of a light responsive transistor 56 whose output is connected to a receiver 58.

Signals transmitted in bit serial format by driver/transmitter 12c on circuit board 50 are coupled to board 56 through cable 54 and then received by the transistor 56 and receiver 58 for digital signal processing by conventional digital control circuitry (not shown) which commonly includes a microprocessor, within the calibrator. The guarded crossing comprising cable 54, LED 52 and light-responsive transistor 56, enables circuit boards 50 and 56 to be maintained electrically isolated from each other, in separate ground planes, so that there is no coupling of ground loop currents there between. Furthermore, there is virtually no coupling of signal transients between the two circuit boards, because the optical fiber cable 54 has virtually no internal capacitance between the ends thereof. As another advantage, the boards 50 and 56 can be physically separated from each other by a substantial distance, e.g., four inches or more, providing improved packaging utility, and enabling the boards to be positioned and shielded to minimize electromagnetic interference.

In FIG. 6, another embodiment of the guarded crossover is shown, wherein signals are coupled between boards 50a and 56a through a guarded crossover in bit parallel format, format. In this embodiment, digital signals at the output of A/D converter 12b are supplied, in bit parallel to parallel driver 12d that in turn applies digital signals to be transmitted to board 56a, in bit parallel format, i.e., one bit of each word to be transmitted is supplied to a different one of a series array of LEDs 52a. Each LED 52a in turn is coupled to a respective light responsive transistor 57a on circuit board 56a through a corresponding optical fiber cable 54a. Thus, digital signals are transmitted from board 50a to board 56a one word at a time, with each bit of the word coupled optically through a different one of the optical fiber cables 54a. This configuration is advantageous because the speed of transmission of data (baud) required between boards is substantially reduced compared to that required in serial data transmission carried out in FIG. 5.

Thus, there have been described two embodiments, one involving serial data transmission and the other involving parallel data transmission, of a guarded crossover between different circuit sections on separate circuit boards of electronic instrumentation, wherein circuits are maintained electrically isolated from each other on different ground planes and further wherein there is virtually no capacitive coupling between high frequency signals therebetween. The guarded crossing, although described in the context of a multifunction calibrator having isolated analog and digital circuit sections, has more general application into other circuit environments wherein multiple circuit sections within a common electronic system must be electrically isolated from each other but be in signal communication.

In this disclosure, there is shown and described only the preferred embodiment of the invention, but, as aforementioned, it is to be understood that the invention is capable of use in various other combinations and environments and is capable of changes or modifications within the scope of the inventive concept as expressed herein. For example, although the preferred embodiment described herein contemplates guarded crossing between analog and digital sections, it should be clear that the guarded crossing is also applicable to separate two digital sections or two hybrid sections each containing analog and digital circuitry, etc.

We claim:

1. For a circuit partitioned into analog and digital sections having separate ground planes but located within a common housing, guard crossing apparatus for electrically isolating said analog and digital sections from each other, comprising:

an optical fiber transmission medium in said housing for carrying digital signals therethrough;

first electrooptical transmitter and receiver means in said analog section interfacing analog circuitry therein with one end of said optical fiber transmission medium; and second electrooptical transmitter and receiver means in said digital section for interfacing digital circuitry therein with an opposite end of said optical fiber transmission medium.

2. The apparatus of claim 1, wherein said analog section includes signal converter means between analog circuitry within said analog section and said optical fiber cable medium for converting analog signals outgoing from said analog section to said digital section into digital signals and for converting digital signals incoming to said analog section into analog signals.

3. The apparatus of claim 2, wherein each said first and second electrooptical transmitter and receiver means includes a transmitter responsive to electrical signals applied thereto for generating corresponding light signals, and a receiver responsive to light signals applied thereto for generating corresponding electrical signals.

4. The apparatus of claim 1, wherein said analog and digital sections are located on separate circuit boards, and said optical fiber transmission medium extends therebetween.

5. The apparatus of claim 2, wherein said optical fiber transmission medium comprises a first optical fiber cable means between the transmitter of said first electrooptical transmitter and receiver means and the receiver of said second electrooptical transmitter and receiver means, and a second optical fiber cable means between the transmitter of said second electrooptical transmitter and receiver means and the receiver of said first electrooptical transmitter and receiver means.

6. The apparatus of claim 2, wherein said digital section comprises digital circuitry for processing digital signals in bit serial format, and said optical fiber transmission medium comprises a first optical fiber cable between the transmitter of said first electrooptical transmitter and receiver means and the receiver of said second electrooptical transmitter and receiver means for carrying bit serial digital signals from said analog section to said digital section, and a second optical fiber cable between the transmitter of said second electrooptical transmitter and receiver means and the receiver of said first electrooptical transmitter and receiver means for carrying bit serial digital signals from said digital section to said analog section.

7. The apparatus of claim 2, wherein said digital section comprises digital circuitry for processing digital signals in bit parallel format, and said optical fiber transmission medium comprises a plurality first optical fiber cables between the transmitter of said first electrooptical transmitter and receiver means and the receiver of said second electrooptical transmitter and receiver means for carrying respectively parallel bits of said bit parallel digital signals from said analog section to said digital section, and a plurality of second optical fiber cables between the transmitter of said second electrooptical transmitter and receiver means and the receiver of said first electrooptical transmitter and receiver means for carrying respectively parallel bits of said bit parallel digital signals from said digital section to said analog section.

8. For a calibrator system which generates precisely controlled analog output signals for calibration of laboratory equipment and which includes an analog circuit section for generating said output analog signals in response to digital control signals supplied thereto and a digital circuit section for developing said digital control signals, said analog and digital circuit sections having separate ground planes but located in a common housing, guard crossing apparatus for electrically isolating said analog and digital sections in said housing from each other, comprising:

an optical fiber transmission medium in said housing for carrying digital signals therethrough;

first electrooptical transmitter and receiver means in said analog section of said calibrator interfacing analog circuitry therein with one end of said optical fiber transmission medium; and second electrooptical transmitter and receiver means in said digital section of said calibrator for interfacing digital circuitry therein with an opposite end of said optical fiber transmission medium.

9. The apparatus of claim 8, wherein said optical fiber transmission medium comprises a first optical fiber cable means between the transmitter of said first electrooptical transmitter and receiver means and the receiver of said second electrooptical transmitter and receiver means, and a second optical fiber cable means between the transmitter of said second electrooptical transmitter and receiver means and the receiver of said first electrooptical transmitter and receiver means.

10. The apparatus of claim 9, wherein said digital section comprises digital circuitry for processing digital signals in bit serial format, and said optical fiber cable means comprises a first optical fiber cable between the transmitter of said first electrooptical transmitter and receiver means and the receiver of said second electrooptical transmitter and receiver means for carrying bit serial digital signals from said analog section to said digital section, and a second optical fiber cable between the transmitter of said second electrooptical transmitter and receiver means and the receiver of said first electrooptical transmitter and receiver means for carrying bit serial digital signals from said digital section to said analog section.

11. The apparatus of claim 9, wherein said digital section comprises digital circuitry for processing digital signals in bit parallel format, and said optical fiber cable means comprises a plurality first optical fiber cables between the transmitter of said first electrooptical transmitter and receiver means and the receiver of second electrooptical transmitter and receiver means for carrying respectively parallel bits of said bit parallel digital signals from said analog section to said digital section, and a plurality of second optical fiber cables between the transmitter of said second electrooptical transmitter and receiver means and the receiver of said first electrooptical transmitter and receiver means for carrying respectively parallel bits of said bit parallel digital signals from said digital section to said analog section.

12. The apparatus of claim 9, wherein said analog section includes signal converter means between analog circuitry within said analog section of said calibrator and said optical fiber cable means for converting analog signals outgoing from said analog section to said digital section into digital signals and for converting digital signals incoming to said analog section into analog signals.

13. The apparatus of claim 12, wherein each said first and second electrooptical transmitter and receiver means includes a transmitter responsive to electrical signals applied thereto for generating corresponding light signals, and a receiver responsive to light signals applied thereto for generating corresponding electrical signals.

14. The apparatus of claim 11, wherein said analog and digital sections are located on separate circuit boards, and said optical fiber cable extends therebetween.

15. For a circuit provided on first and second circuit boards within a single housing and wherein the circuit boards comprise respectively electrically isolated first and second circuit sections of a common electronic circuit having separate ground planes and a signal flow path therebetween, guard crossing apparatus for electrically isolating said sections from each other, comprising:

an optical fiber transmission medium in said housing for carrying optical signals therethrough;

first electrooptical transmitter and receiver means in said first circuit section interfacing circuitry therein with one end of said optical fiber transmission medium; and second electrooptical transmitter and receiver means in said second section for interfacing circuitry therein with an opposite end of said optical fiber transmission medium.

16. The apparatus of claim 15, wherein said first section comprises digital circuitry for processing digital signals in bit serial format, and said optical fiber transmission medium comprises a first optical fiber cable between the transmitter of said first electrooptical transmitter and receiver means and the receiver of said second electrooptical transmitter and receiver means for carrying bit serial digital signals from said first section to said second section, and a second optical fiber cable between the transmitter of said second electrooptical transmitter and receiver means and the receiver of said first electrooptical transmitter and receiver means for carrying bit serial digital signals from said second section to said first section.

17. The apparatus of claim 15, wherein said first section comprises digital circuitry for processing digital signals in bit parallel format, and said optical fiber transmission medium comprises a plurality first optical fiber cables between the transmitter of said first electrooptical transmitter and receiver means and the receiver of said second electrooptical transmitter and receiver means for carrying respectively parallel bits of said bit parallel digital signals from said first section to said second section, and a plurality of second optical fiber cables between the transmitter of said second electrooptical transmitter and receiver means and the receiver of said first electrooptical transmitter and receiver means for carrying respectively parallel bits of said bit parallel digital signals from said first section to said second section.

* * * * *